United States Patent
Miyazawa

(10) Patent No.: US 10,559,740 B2
(45) Date of Patent: Feb. 11, 2020

(54) DRIVING DEVICE, PIEZOELECTRIC MOTOR, ELECTRONIC COMPONENT CONVEYANCE APPARATUS, AND ROBOT

(71) Applicant: Seiko Epson Corporation, Tokyo (JP)

(72) Inventor: Osamu Miyazawa, Shimosuwa (JP)

(73) Assignee: Seiko Epson Corporation (JP)

( * ) Notice: Subject to any disclaimer, the term of this patent is extended or adjusted under 35 U.S.C. 154(b) by 316 days.

(21) Appl. No.: 15/709,864

(22) Filed: Sep. 20, 2017

(65) Prior Publication Data

US 2018/0090668 A1 Mar. 29, 2018

(30) Foreign Application Priority Data

Sep. 26, 2016 (JP) .................................. 2016-186598

(51) Int. Cl.
*H01L 41/09* (2006.01)
*H02N 2/10* (2006.01)

(52) U.S. Cl.
CPC ............ *H01L 41/09* (2013.01); *H02N 2/101* (2013.01)

(58) Field of Classification Search
CPC ........ H01L 41/09; H02N 2/101; H02N 2/026; H02N 2/0095; H02N 2/103; H02N 2/108; H02N 2/0075; H02N 2/0065; H02N 2/002; H02N 2/06; H02N 2/028; B25J 9/126

See application file for complete search history.

(56) References Cited

U.S. PATENT DOCUMENTS

| | | | |
|---|---|---|---|
| 6,807,859 B2 | 10/2004 | Tabota | |
| 7,646,136 B2* | 1/2010 | Adachi | H01L 41/083 310/323.16 |
| 9,513,263 B2 | 12/2016 | Endo | |
| 9,634,587 B2 | 4/2017 | Kikuchi et al. | |
| 2005/0082947 A1* | 4/2005 | Li | H02N 2/004 310/328 |
| 2008/0278033 A1* | 11/2008 | Adachi | H01L 41/083 310/317 |
| 2011/0241488 A1* | 10/2011 | Kimura | H02N 2/0015 310/323.16 |
| 2016/0241165 A1* | 8/2016 | Miyazawa | H02N 2/004 |
| 2017/0279033 A1* | 9/2017 | Kajino | A61B 34/30 |

FOREIGN PATENT DOCUMENTS

| | | |
|---|---|---|
| JP | 2003-254989 A | 9/2003 |
| JP | 2008-278712 A | 11/2008 |
| JP | 2011-181245 A | 9/2011 |
| JP | 2015-002634 A | 1/2015 |
| JP | 2015-023995 A | 2/2015 |

* cited by examiner

*Primary Examiner* — Bryan P Gordon
(74) *Attorney, Agent, or Firm* — Harness, Dickey & Pierce, P.L.C.

(57) ABSTRACT

A driving device includes a plurality of motive power generators that receive electric power supply and generate motive power, the plurality of motive power generators form a plurality of sets of motive power generators in which two or more of the motive power generators are electrically parallel-connected, and the plurality of sets of motive power generators are electrically series-connected. A driving device includes a plurality of vibrators that receive electric power supply and vibrate and provide drive power for driving a driven member to the driven member, the plurality of vibrators form a plurality of sets of vibrators in which two or more of the vibrators are electrically parallel-connected, and the plurality of sets of vibrators are electrically series-connected.

20 Claims, 10 Drawing Sheets

DRIVING DEVICE, PIEZOELECTRIC MOTOR, ELECTRONIC COMPONENT CONVEYANCE APPARATUS, AND ROBOT

BACKGROUND

1. Technical Field

The present invention relates to a driving device, piezoelectric motor, electronic component conveyance apparatus, and robot.

2. Related Art

Driving devices including pluralities of piezoelectric elements (vibrators) are known (for example, see Patent Document 1 (JP-A-2008-278712)). The driving device described in Patent Document 1 has a plurality of piezoelectric elements and the plurality of piezoelectric elements are series-connected. The driving device has an advantage that, even when a short circuit abnormality that a current path is short-circuited is caused in one piezoelectric element, electric power may be supplied to the other piezoelectric elements and the elements may be activated, and thereby, the operation of the driving device may be continued.

However, in the driving device described in Patent Document 1, when an open abnormality that the current path opens is caused in one piezoelectric element, it is impossible to supply electric power to all of the piezoelectric elements, and thereby, the driving device stops.

SUMMARY

An advantage of some aspects of the invention is to provide a driving device, piezoelectric motor, electronic component conveyance apparatus, robot that may operate the driving device even when part of pluralities of motive power generators and vibrators fails.

The advantage can be achieved by the following configurations.

A driving device according to an aspect of the invention includes a plurality of motive power generators that receive electric power supply and generate motive power, the plurality of motive power generators form a plurality of sets of motive power generators in which two or more of the motive power generators are electrically parallel-connected, and the plurality of sets of motive power generators are electrically series-connected.

With this configuration, even when a short circuit abnormality that a current path is short-circuited is caused in one motive power generator of one set of motive power generators, electric power may be supplied to the other sets of motive power generators and the motive power generators may be activated, and thereby, operation of the driving device may be continued.

Further, even when an open abnormality that a current path opens is caused in one motive power generator of one set of motive power generators, electric power may be supplied to the motive power generators without the open abnormality and the other sets of motive power generators and the motive power generators may be activated, and thereby, the operation of the driving device may be continued.

A driving device according to an aspect of the invention includes a plurality of vibrators that receive electric power supply and vibrate and provide drive power for driving a driven member to the driven member, the plurality of vibrators form a plurality of sets of vibrators in which two or more of the vibrators are electrically parallel-connected, and the plurality of sets of vibrators are electrically series-connected.

With this configuration, even when a short circuit abnormality that a current path is short-circuited is caused in one vibrator of one set of vibrators, electric power may be supplied to the other sets of vibrators and the vibrators may be activated, and thereby, operation of the driving device may be continued.

Further, even when an open abnormality that a current path opens is caused in one vibrator of one set of vibrators, electric power may be supplied to the vibrators without the open abnormality and the other sets of vibrators and the vibrators may be activated, and thereby, the operation of the driving device may be continued.

In the driving device according to the aspect of the invention, it is preferable that a drive circuit that drives the plurality of vibrators is provided.

With this configuration, the driving device may be operated by the drive circuit.

In the driving device according to the aspect of the invention, it is preferable that a transmitting portion that transmits the drive power of the vibrators to the driven member is provided.

With this configuration, the drive power of the vibrators may be efficiently provided to the driven member.

In the driving device according to the aspect of the invention, it is preferable that the two or more vibrators forming the set of vibrators are stacked one on top of the other.

With this configuration, compared to the case where the vibrators are not stacked, the smaller size, lighter weight, and higher output may be realized.

In the driving device according to the aspect of the invention, it is preferable that the vibrator includes a piezoelectric element.

With this configuration, compared to the case where electromagnetic motors is used, the smaller size, lighter weight, and higher output may be realized.

A piezoelectric motor according to an aspect of the invention includes a driven member, and the driving device according to the aspect of the invention that drives the driven member.

With this configuration, even when a short circuit abnormality that a current path is short-circuited is caused in one vibrator of one set of vibrators, electric power may be supplied to the other sets of vibrators and the vibrators may be activated, and thereby, operation of the piezoelectric motor may be continued.

Further, even when an open abnormality that a current path opens is caused in one vibrator of one set of vibrators, electric power may be supplied to the vibrators without the open abnormality and the other sets of vibrators and the vibrators may be activated, and thereby, the operation of the piezoelectric motor may be continued.

An electronic component conveyance apparatus according to an aspect of the invention includes the driving device according to the aspect of the invention.

With this configuration, even when a short circuit abnormality that a current path is short-circuited is caused in one vibrator of one set of vibrators, electric power may be supplied to the other sets of vibrators and the vibrators may be activated, and thereby, operation of the electronic component conveyance apparatus may be continued.

Further, even when an open abnormality that a current path opens is caused in one vibrator of one set of vibrators, electric power may be supplied to the vibrators without the open abnormality and the other sets of vibrators and the vibrators may be activated, and thereby, the operation of the electronic component conveyance apparatus may be continued.

A robot according to an aspect of the invention includes the driving device according to the aspect of the invention.

With this configuration, even when a short circuit abnormality that a current path is short-circuited is caused in one vibrator of one set of vibrators, electric power may be supplied to the other sets of vibrators and the vibrators may be activated, and thereby, operation of the robot may be continued.

Further, even when an open abnormality that a current path opens is caused in one vibrator of one set of vibrators, electric power may be supplied to the vibrators without the open abnormality and the other sets of vibrators and the vibrators may be activated, and thereby, the operation of the robot may be continued.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a driving device, piezoelectric motor, electronic component conveyance apparatus, and robot according to the invention will be explained in detail based on embodiments shown in the accompanying drawings.

First Embodiment

Figure 1:
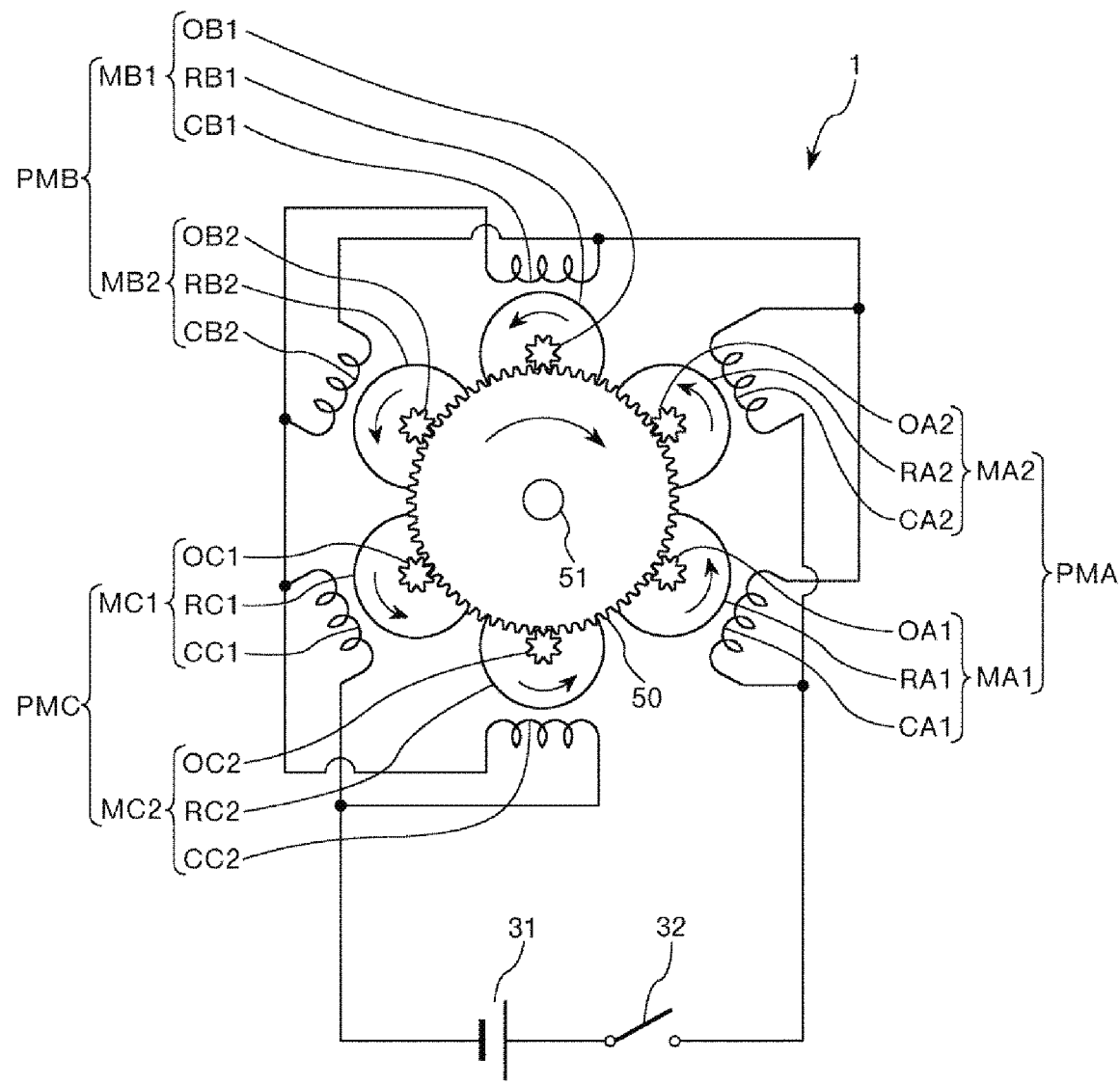
FIG. 1 is a plan view and a circuit diagram showing a driving device according to a first embodiment of the invention.

FIG. 1 is a plan view and a circuit diagram showing a driving device according to the first embodiment of the invention.

As shown in FIG. 1, a driving device 1 includes six motive power generators MA1, MA2, MB1, MB2, MC1, and MC2 as examples of a plurality of motive power generators that receive supply of electric power and generate motive power (force), a power supply 31, a switch 32, a driven member 50 (driven part), and an output shaft 51 provided at the center of the driven member 50. As the motive power generators MA1, MA2, MB1, MB2, MC1, and MC2, various kinds of electromagnetic motors may be respectively used.

The motive power generator MA1 includes a coil CA1, a rotor RA1, and an output part OA1 provided at the center of the rotor RA1. The rotor RA1 is e.g. a rotating member having a permanent magnet and, when a current flows in the coil CA1, rotates by an electromagnetic force.

The driven member 50 has a circular plate shape in the embodiment. The output part OA1 and the driven member 50 respectively have gears in e.g. outer circumferential portions, and the gears mesh with each other. In the motive power generator MA1, when electric power is supplied from the power supply 31 and a current flows in the coil CA1, the rotor RA1 rotates, the driven member 50 is driven, i.e., rotates, via the output part OA1.

Similarly, the motive power generator MA2 includes a coil CA2, a rotor RA2, and an output part OA2 at the center of the rotor RA2. Further, similarly, the motive power generator MB1 includes a coil CB1, a rotor RB1, and an output part OB1 at the center of the rotor RB1. Similarly, the motive power generator MB2 includes a coil CB2, a rotor RB2, and an output part OB2 at the center of the rotor RB2. Furthermore, similarly, the motive power generator MC1 includes a coil CC1, a rotor RC1, and an output part OC1 at the center of the rotor RC1. Similarly, the motive power generator MC2 includes a coil CC2, a rotor RC2, and an output part OC2 at the center of the rotor RC2. When electric power is supplied from the power supply 31, the motive power generators MA2, MB1, MB2, MC1, and MC2 similarly drive the driven member 50.

Note that the configuration of the driven member 50 is not limited to the configuration in FIG. 1. In the embodiment, a member that rotationally moves is used as the driven member, however, e.g. a member that linearly moves may be used as the driven member.

In the driving device 1, the plurality of motive power generators form a plurality of sets of motive power generators including two or more motive power generators electrically connected in parallel (hereinafter, simply referred to as "parallel"), in the embodiment, three sets of motive power generators PMA, PMB, and PMC.

Specifically, first, the coil CA1 and the coil CA2 are parallel-connected. Thereby, the motive power generator MA1 and the motive power generator MA2 are parallel-connected and these form the set of motive power generators PMA.

Similarly, the coil CB1 and the coil CB2 are parallel-connected. Thereby, the motive power generator MB1 and the motive power generator MB2 are parallel-connected and these form the set of motive power generators PMB.

Further, similarly, the coil CC1 and the coil CC2 are parallel-connected. Thereby, the motive power generator MC1 and the motive power generator MC2 are parallel-connected and these form the set of motive power generators PMC.

The plurality of sets of motive power generators, in the embodiment, three sets of motive power generators PMA, PMB, and PMC are electrically series-connected (hereinafter, simply referred to as "series"). That is, the coil CA1 and coil CA2, the coil CB1 and coil CB2, and the coil CC1 and coil CC2 are series-connected.

The arrangement of the motive power generators MA1, MA2, MB1, MB2, MC1, and MC2 is not particularly limited, but, in the embodiment, the motive power generators MA1, MA2, MB1, MB2, MC1, and MC2 are arranged at equal angular intervals in the order of the motive power generators MA1, MA2, MB1, MB2, MC1, and MC2 counterclockwise in FIG. 1. That is, the motive power generator MA1 and the motive power generator MA2 in the set of motive power generators PMA are provided to be adjacent to each other. Similarly, the motive power generator MB1 and the motive power generator MB2 in the set of motive power generators PMB are provided to be adjacent to each other. Similarly, the motive power generator MC1 and the motive power generator MC2 in the set of motive power generators PMC are provided to be adjacent to each other. Further, the motive power generator MA1 and the motive power generator MB2 are provided to face each other with the driven member 50 in between. Similarly, the motive power generator MA2 and the motive power generator MC1 are provided to face each other with the driven member 50 in between. Similarly, the motive power generator MB1 and the motive power generator MC2 are provided to face each other with the driven member 50 in between.

The power supply 31 has a function of supplying electric power to the driving device 1, i.e., the motive power generators MA1, MA2, MB1, MB2, MC1, and MC2. The power supply 31 is connected to the motive power generators MA1, MA2, MB1, MB2, MC1, and MC2 via the switch 32. When the switch 32 is turned on, electric power is supplied from the power supply 31 to the motive power generators MA1, MA2, MB1, MB2, MC1, and MC2, and, when the switch 32 is turned off, the electric power supply stops.

Note that the device may be adapted to change the directions of the currents flowing in the coils CA1, CA2, CB1, CB2, CC1, and CC2 (not shown).

As described above, according to the driving device 1, for example, even when a short circuit abnormality that a current path is short-circuited is caused in the coil CA1 of the motive power generator MA1 of the set of motive power generators PMA, electric power may be supplied to the other sets of motive power generators PMB and PMC. Thereby, the sets of motive power generators PMB and PMC may be activated, the driven member 50 may be driven without stopping, and the operation of the driving device 1 may be continued. When a short circuit abnormality is caused in another coil, the operation of the driving device 1 may be similarly continued.

Or, for example, when an open abnormality that the current path opens is caused in the coil CA1 of the motive power generator MA1 of the set of motive power generators PMA, electric power may be supplied to the other motive power generator MA2 belonging to the same set of motive power generators PMA and the other sets of motive power generators PMB and PMC. Thereby, the motive power generator MA2 and the sets of motive power generators PMB and PMC may be activated, the driven member 50 may be driven without stopping, and the operation of the driving device 1 may be continued. When an open abnormality is caused in another coil, the operation of the driving device 1 may be similarly continued.

Modified Example 1

In the first embodiment, the two motive power generators forming one set of motive power generators are provided to be adjacent to each other, however, other arrangements may be employed. The other arrangements include e.g. an arrangement in which the two motive power generators forming one set of motive power generators are provided with the driven member 50 in between.

Modified Example 2

In the first embodiment, the two motive power generators are parallel-connected and these form one set of motive power generators, however, not limited to that. Three or more motive power generators may be parallel-connected and these may form one set of motive power generators.

Modified Example 3

In the first embodiment, the two sets of motive power generators are series-connected, however, not limited to that. Three or more sets of motive power generators may be series-connected.

Note that the modified examples 1 to 3 may be respectively applied to the respective embodiments, which will be described later.

Second Embodiment

Figure 2:
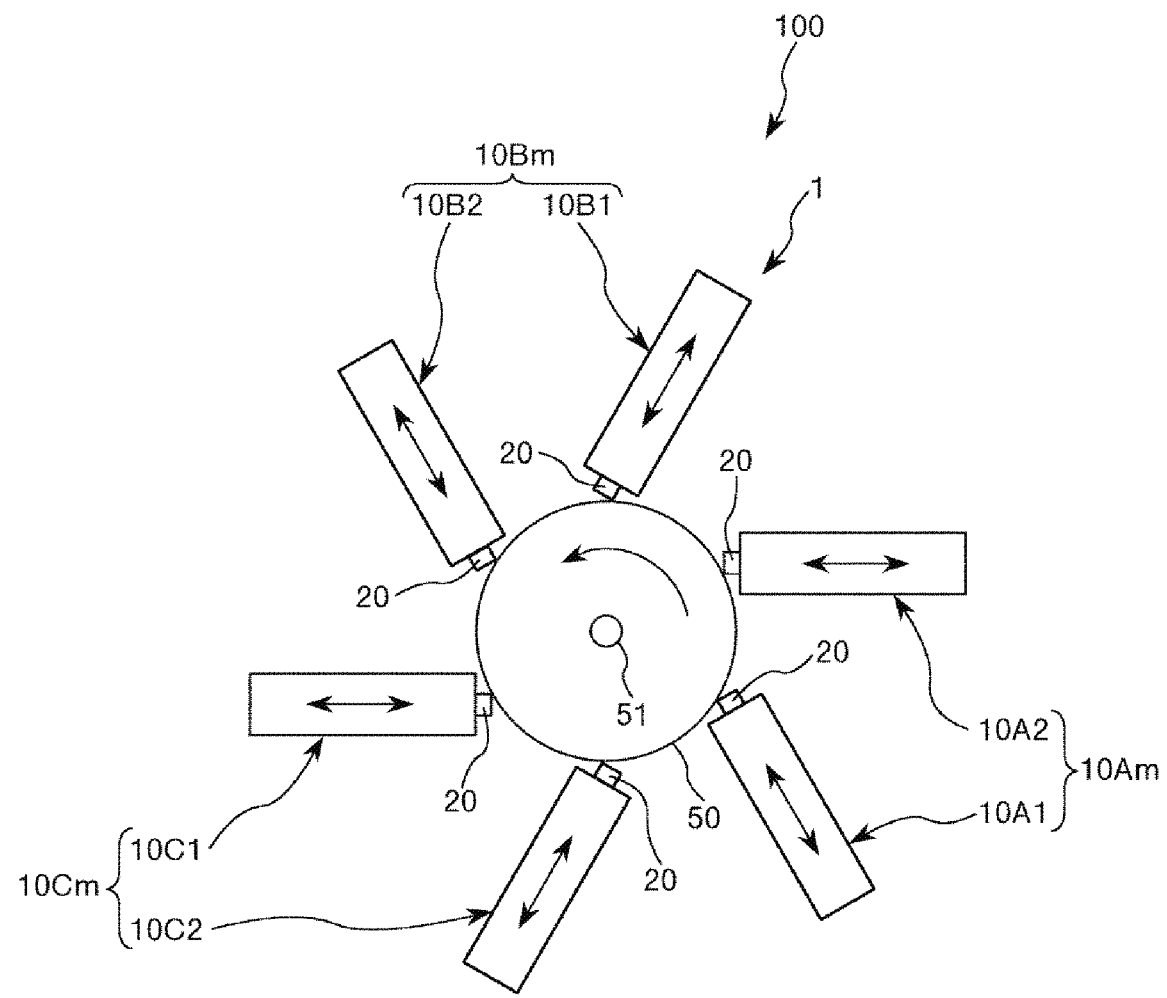
FIG. 2 is a plan view showing a driving device and a piezoelectric motor according to a second embodiment of the invention.
Figure 3:
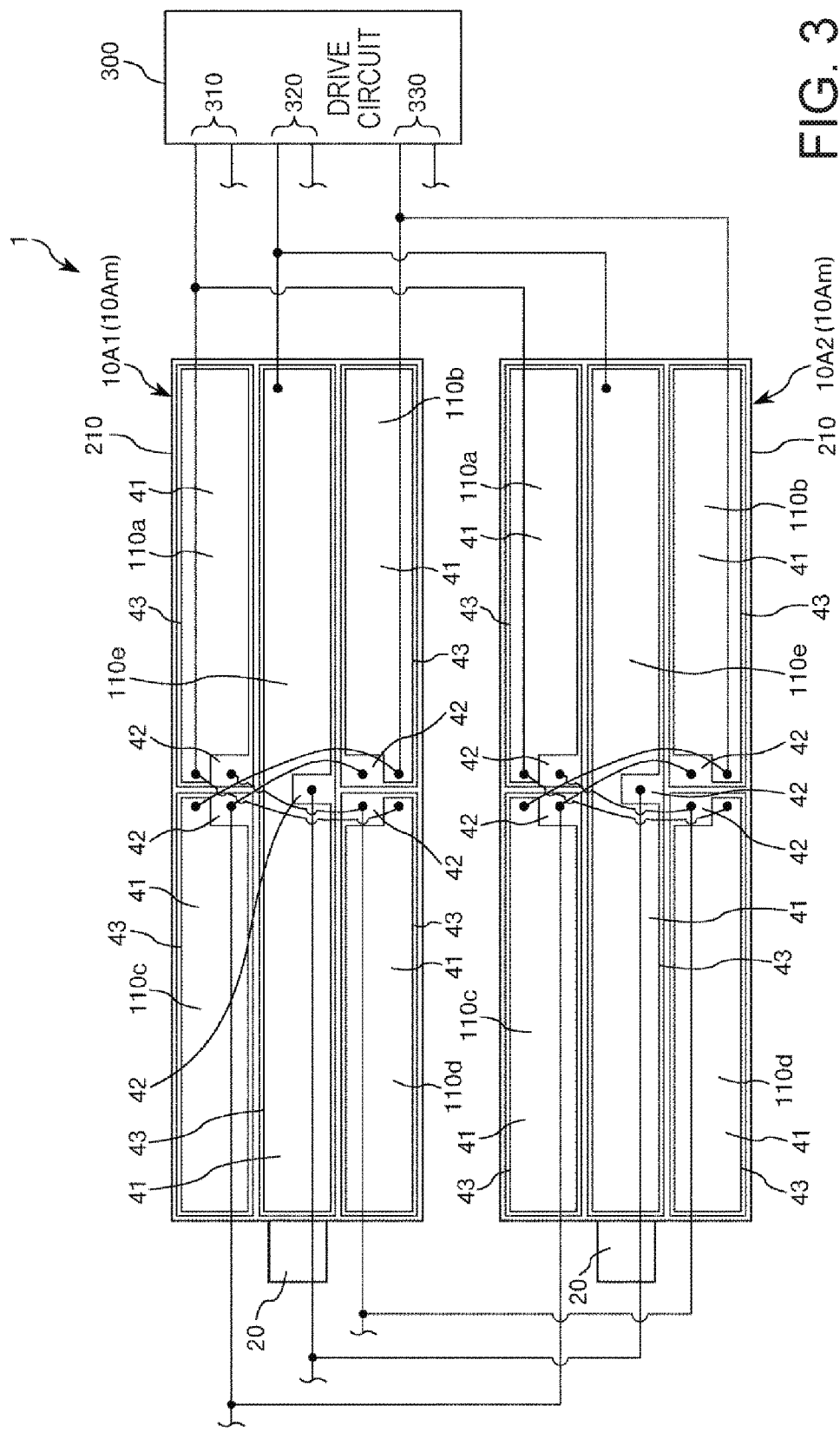
FIG. 3 shows piezoelectric elements and wires of the driving device shown in FIG. 2.
Figure 4:
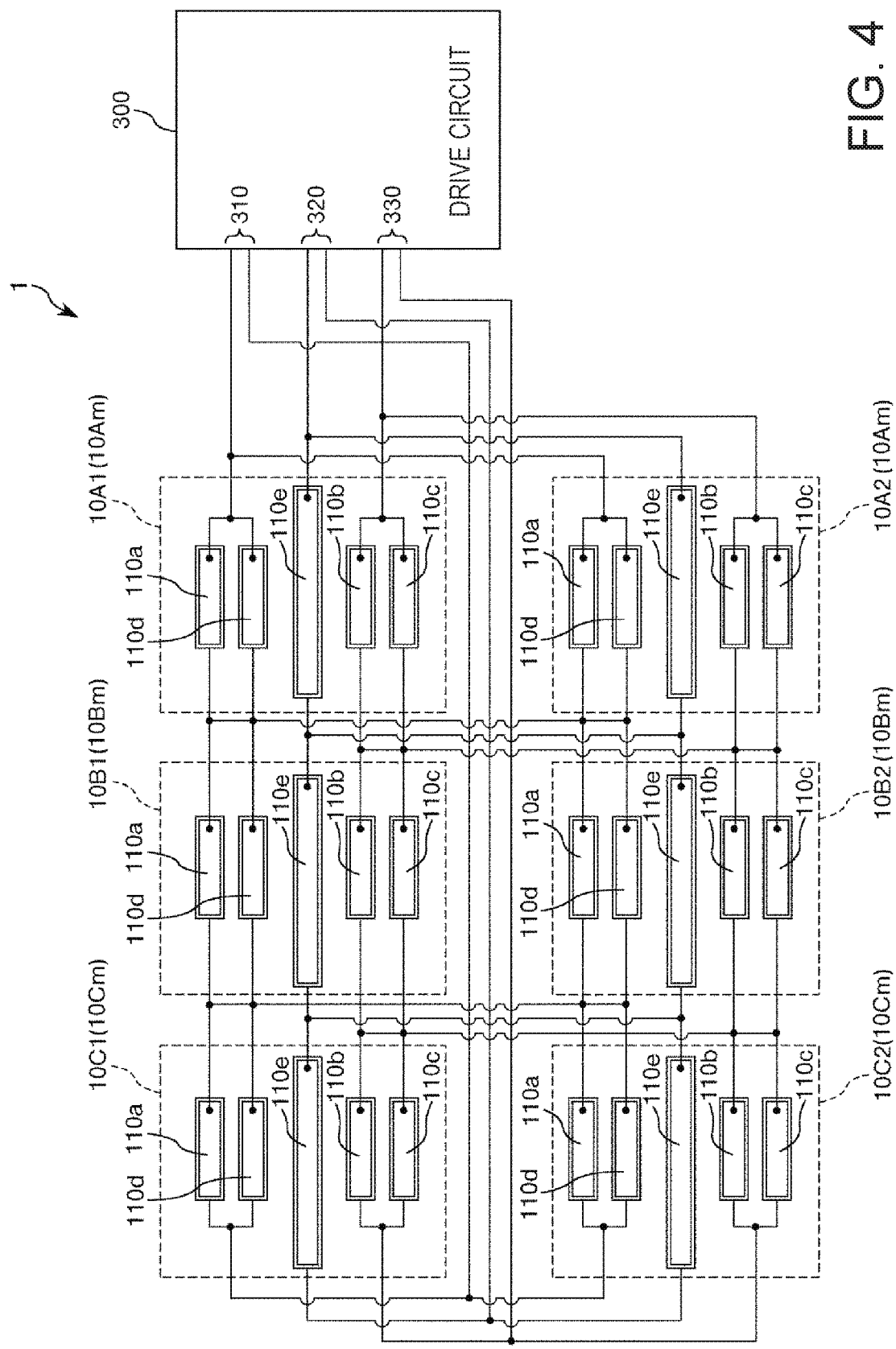
FIG. 4 shows wires of the driving device shown in FIG. 2.

FIG. 2 is a plan view showing a driving device and a piezoelectric motor according to the second embodiment of the invention. FIG. 3 shows piezoelectric elements and wires of the driving device shown in FIG. 2. FIG. 4 shows wires of the driving device shown in FIG. 2.

As below, the second embodiment will be explained with a focus on the differences from the above described embodiment and the explanation of the same items will be omitted.

As shown in FIGS. 2 and 3, a driving device 1 of the second embodiment includes six vibrators (piezoelectric actuators) 10A1, 10A2, 10B1, 10B2, 10C1, and 10C2 as examples of a plurality of vibrators that provide drive power for driving a driven member to the driven member, and a drive circuit 300 that drives the vibrators 10A1, 10A2, 10B1, 10B2, 10C1, and 10C2.

Further, a piezoelectric motor 100 includes a driven member 50, an output shaft 51 provided at the center of the driven member 50, and the driving device 1 that drives the driven member 50. Note that, in the embodiment, no gear is provided in an outer circumferential portion of the driven member 50.

Next, the vibrators 10A1, 10A2, 10B1, 10B2, 10C1, and 10C2 will be explained, however, these configurations are the same and the vibrator 10A1 will be representatively explained.

The vibrator 10A1 includes a vibrating plate 210, a transmitting portion 20 (contact portion) provided in the end part of the vibrating plate 210 and transmitting drive power of the vibrator 10A1 to the driven member 50, and five piezoelectric elements 110a, 110b, 110c, 110d, and 110e provided on the vibrating plate 210. The transmitting portion 20 is provided, and thereby, the drive power of the vibrator 10A1 may be efficiently provided to the driven member 50.

The vibrating plate 210 has a nearly rectangular shape in a plan view as seen from the thickness direction of the vibrating plate 210 (hereinafter, also simply referred to as "plan view"). The piezoelectric elements 110a, 110b, 110c, 110d, and 110e are provided on one surface of the vibrating plate 210. Further, the transmitting portion 20 is provided to protrude from the vibrating plate 210 in the tip end part in the longitudinal direction of the vibrating plate 210 (the end part on the driven member 50 side) in the center part in the width direction (lateral direction).

As the vibrating plate 210, e.g. a silicon substrate may be used. Further, an insulating layer (not shown) is provided on the surface of the vibrating plate 210. For example, when a silicon substrate is used as the vibrating plate 210, the insulating layer may be formed using silicon oxide formed by thermal oxidation of the surface of the silicon substrate.

The piezoelectric element 110e is provided along the longitudinal direction of the vibrating plate 210 in the center part in the width direction of the vibrating plate 210. With respect to the piezoelectric element 110e, on one side in the width direction of the vibrating plate 210, the piezoelectric elements 110a, 110c are provided along the longitudinal direction of the vibrating plate 210 and, on the other side, the piezoelectric elements 110b, 110d are provided along the longitudinal direction of the vibrating plate 210. Further, the piezoelectric elements 110c, 110d are located on the tip end side, i.e., the transmitting portion 20 side.

Thus arranged piezoelectric elements 110a, 110b, 110c, 110d, and 110e respectively have second electrodes 42 provided on the vibrating plate 210, piezoelectric materials 43 provided on the second electrodes 42, and first electrodes 41 provided on the piezoelectric materials 43. Note that the respective piezoelectric materials 43 of the piezoelectric elements 110a, 110b, 110c, 110d, and 110e may be individually provided or integrally provided.

The constituent materials of the first electrode 41 and the second electrode 42 are not particularly limited, but e.g. metal materials including aluminum (Al), nickel (Ni), gold (Au), platinum (Pt), iridium (Ir), and copper (Cu) are used. The first electrodes 41 and the second electrodes 42 may be respectively formed by evaporation, sputtering, or the like.

The piezoelectric materials 43 expand and contract in directions along the longitudinal direction of the vibrating plate 210 by application of an electric field in the directions along the thickness direction of the vibrating plate 210. As the constituent material of the piezoelectric material 43, e.g. piezoelectric ceramics including lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate may be used. The piezoelectric material 43 of the piezoelectric ceramics may be formed from a bulk material or formed using a sol-gel method, for example. Note that, as the constituent material of the piezoelectric material 43, polyvinylidene fluoride, quartz crystal, or the like may be used in addition to the above described piezoelectric ceramics.

The shape of the transmitting portion 20 is not particularly limited, but, in the embodiment, a rectangular shape in the plan view as seen from the thickness direction of the vibrating plate 210.

The constituent material of the transmitting portion 20 is not particularly limited, but a material with good abrasion resistance is preferably used. The material with good abrasion resistance includes e.g. various ceramics such as alumina and zirconia, sapphire, and quartz crystal.

Note that the transmitting portion 20 may be joined to the vibrating plate 210 using e.g. an adhesive or integrally formed with the vibrating plate 210.

The drive circuit 300 has three terminal pairs 310, 320, and 330. The terminal pair 310 is terminals that supply electric power to the piezoelectric elements 110a, 110d of the vibrators 10A1, 10A2, 10B1, 10B2, 10C1, and 10C2. The terminal pair 320 is terminals that supply electric power to the piezoelectric elements 110e of the vibrators 10A1, 10A2, 10B1, 10B2, 10C1, and 10C2. The terminal pair 330 is terminals that supply electric power to the piezoelectric elements 110b, 110c of the vibrators 10A1, 10A2, 10B1, 10B2, 10C1, and 10C2. The driving device 1 may be operated by the drive circuit 300.

The vibrator 10A1 receives the electric power supply from the drive circuit 300 and vibrates, and drive power by the vibration is transmitted to the driven member 50 by the transmitting portion 20 and the driven member 50 is driven, i.e. rotates. As below, an example of the driving method of the vibrator 10A1 will be explained. Note that the driving method of the vibrator 10A1 is not limited to the following method.

Drive signals, i.e., alternating voltages at predetermined frequencies are applied by the drive circuit 300 to the respective piezoelectric elements 110a, 110b, 110c, 110d, and 110e so that the phase difference between the piezoelectric elements 110a, 110d and the piezoelectric elements 110b, 110c may be 180° and the phase difference between the piezoelectric elements 110a, 110d and the piezoelectric element 110e may be 30°. Thereby, the vibrating plate 210 flexurally deforms in an S-shape and the tip end of the transmitting portion 20 makes an elliptic motion. As a result, the driven member 50 rotates about the center axis thereof. Or, the alternating voltages are applied to the elements so that the phase difference between the piezoelectric elements 110a, 110d and the piezoelectric element 110e may be 210°, and thereby, the driven member 50 may be reversely rotated.

The vibrator 10A1 is tilted at a predetermined angle, and, as another driving method, alternating voltages at predetermined frequencies are applied by the drive circuit 300 to the piezoelectric elements 110a, 110b, 110c, 110d, and 110e so that the phase of the piezoelectric elements 110a, 110b, 110c, 110d, and 110e may be the same. Thereby, the vibrating plate 210 expands and contracts in the longitudinal directions thereof, and the tip end of the transmitting portion 20 makes a reciprocating motion in the longitudinal directions of the vibrating plate 210. As a result, the driven member 50 rotates about the center axis thereof.

The explanation of the vibrators 10A2, 10B1, 10B2, 10C1, and 10C2 will be omitted.

In the driving device 1, the plurality of vibrators form a plurality of sets of vibrators including two or more vibrators connected in parallel, in the embodiment, three sets of vibrators (sets of piezoelectric actuators) 10Am, 10Bm, and 10Cm.

Specifically, regarding the set of vibrators 10Am, as shown in FIG. 3, the piezoelectric element 110a of the vibrator 10A1, the piezoelectric element 110d of the vibrator 10A1, the piezoelectric element 110a of the vibrator 10A2, and the piezoelectric element 110d of the vibrator 10A2 are parallel-connected. The piezoelectric element 110b of the vibrator 10A1, the piezoelectric element 110c of the vibrator 10A1, the piezoelectric element 110b of the vibrator 10A2, and the piezoelectric element 110c of the vibrator 10A2 are parallel-connected. The piezoelectric element 110e of the vibrator 10A1 and the piezoelectric element 110e of the vibrator 10A2 are parallel-connected.

Thereby, the vibrator 10A1 and the vibrator 10A2 are parallel-connected and the vibrators form the set of vibrators 10Am.

More specifically, first, the first electrode 41 of the piezoelectric element 110a of the vibrator 10A1, the first electrode 41 of the piezoelectric element 110d of the vibrator 10A1, the first electrode 41 of the piezoelectric element 110a of the vibrator 10A2, and the first electrode 41 of the piezoelectric element 110*d* of the vibrator 10A2 are connected. The second electrode 42 of the piezoelectric element 110*a* of the vibrator 10A1, the second electrode 42 of the piezoelectric element 110*d* of the vibrator 10A1, the second electrode 42 of the piezoelectric element 110*a* of the vibrator 10A2, and the second electrode 42 of the piezoelectric element 110*d* of the vibrator 10A2 are connected.

Further, the first electrode 41 of the piezoelectric element 110*b* of the vibrator 10A1, the first electrode 41 of the piezoelectric element 110*c* of the vibrator 10A1, the first electrode 41 of the piezoelectric element 110*b* of the vibrator 10A2, and the first electrode 41 of the piezoelectric element 110*c* of the vibrator 10A2 are connected. The second electrode 42 of the piezoelectric element 110*b* of the vibrator 10A1, the second electrode 42 of the piezoelectric element 110*c* of the vibrator 10A1, the second electrode 42 of the piezoelectric element 110*b* of the vibrator 10A2, and the second electrode 42 of the piezoelectric element 110*c* of the vibrator 10A2 are connected.

The first electrode 41 of the piezoelectric element 110*e* of the vibrator 10A1 and the first electrode 41 of the piezoelectric element 110*e* of the vibrator 10A2 are connected. The second electrode 42 of the piezoelectric element 110*e* of the vibrator 10A1 and the second electrode 42 of the piezoelectric element 110*e* of the vibrator 10A2 are connected.

Regarding the set of vibrators 10Bm, as shown in FIG. 4, similarly, the piezoelectric element 110*a* of the vibrator 10B1, the piezoelectric element 110*d* of the vibrator 10B1, the piezoelectric element 110*a* of the vibrator 10B2, and the piezoelectric element 110*d* of the vibrator 10B2 are parallel-connected. The piezoelectric element 110*b* of the vibrator 10B1, the piezoelectric element 110*c* of the vibrator 10B1, the piezoelectric element 110*b* of the vibrator 10B2, and the piezoelectric element 110*c* of the vibrator 10B2 are parallel-connected. The piezoelectric element 110*e* of the vibrator 10B1 and the piezoelectric element 110*e* of the vibrator 10B2 are parallel-connected.

Thereby, the vibrator 10B1 and the vibrator 10B2 are parallel-connected and the vibrators form the set of vibrators 10Bm. Note that the detailed explanation of the set of vibrators 10Bm like that of the set of vibrators 10Am will be omitted.

Regarding the set of vibrators 10Cm, as shown in FIG. 4, similarly, the piezoelectric element 110*a* of the vibrator 10C1, the piezoelectric element 110*d* of the vibrator 10C1, the piezoelectric element 110*a* of the vibrator 10C2, and the piezoelectric element 110*d* of the vibrator 10C2 are parallel-connected. The piezoelectric element 110*b* of the vibrator 10C1, the piezoelectric element 110*c* of the vibrator 10C1, the piezoelectric element 110*b* of the vibrator 10C2, and the piezoelectric element 110*c* of the vibrator 10C2 are parallel-connected. The piezoelectric element 110*e* of the vibrator 10C1 and the piezoelectric element 110*e* of the vibrator 10C2 are parallel-connected.

Thereby, the vibrator 10C1 and the vibrator 10C2 are parallel-connected and the vibrators form the set of vibrators 10Cm. Note that the detailed explanation of the set of vibrators 10Cm like that of the set of vibrators 10Am will be omitted.

The plurality of sets of vibrators, in the embodiment, three sets of vibrators 10Am, 10Bm, and 10Cm are series-connected. That is, the vibrators 10A1 and 10A2, the vibrators 10B1 and 10B2, and the vibrators 10C1 and 10C2 are series-connected.

The arrangement of the vibrators 10A1, 10A2, 10B1, 10B2, 10C1, and 10C2 is not particularly limited, but, in the embodiment, the vibrators 10A1, 10A2, 10B1, 10B2, 10C1, and 10C2 are arranged at equal angular intervals in the order of the vibrators 10A1, 10A2, 10B1, 10B2, 10C1, and 10C2 counterclockwise in FIG. 2. That is, the vibrator 10A1 and vibrator 10A2 of the set of vibrators 10Am are provided to be adjacent to each other. Similarly, the vibrator 10B1 and vibrator 10B2 of the set of vibrators 10Bm are provided to be adjacent to each other. Similarly, the vibrator 10C1 and vibrator 10C2 of the set of vibrators 10Cm are provided to be adjacent to each other. Further, the vibrator 10A1 and the vibrator 10B2 are provided to face each other with the driven member 50 in between. Similarly, the vibrator 10A2 and the vibrator 10C1 are provided to face each other with the driven member 50 in between. Similarly, the vibrator 10B1 and the vibrator 10C2 are provided to face each other with the driven member 50 in between.

According to the above described second embodiment, the same advantages as those of the above described embodiment, i.e., the advantages that, even when a short circuit abnormality or open abnormality is caused in a part of the current path, the driven member 50 may be driven without stopping and the operation of the driving device 1 may be continued may be exerted.

Further, compared to the case where electromagnetic motors is used, the smaller size, lighter weight, and higher output may be realized.

Third Embodiment

Figure 5:
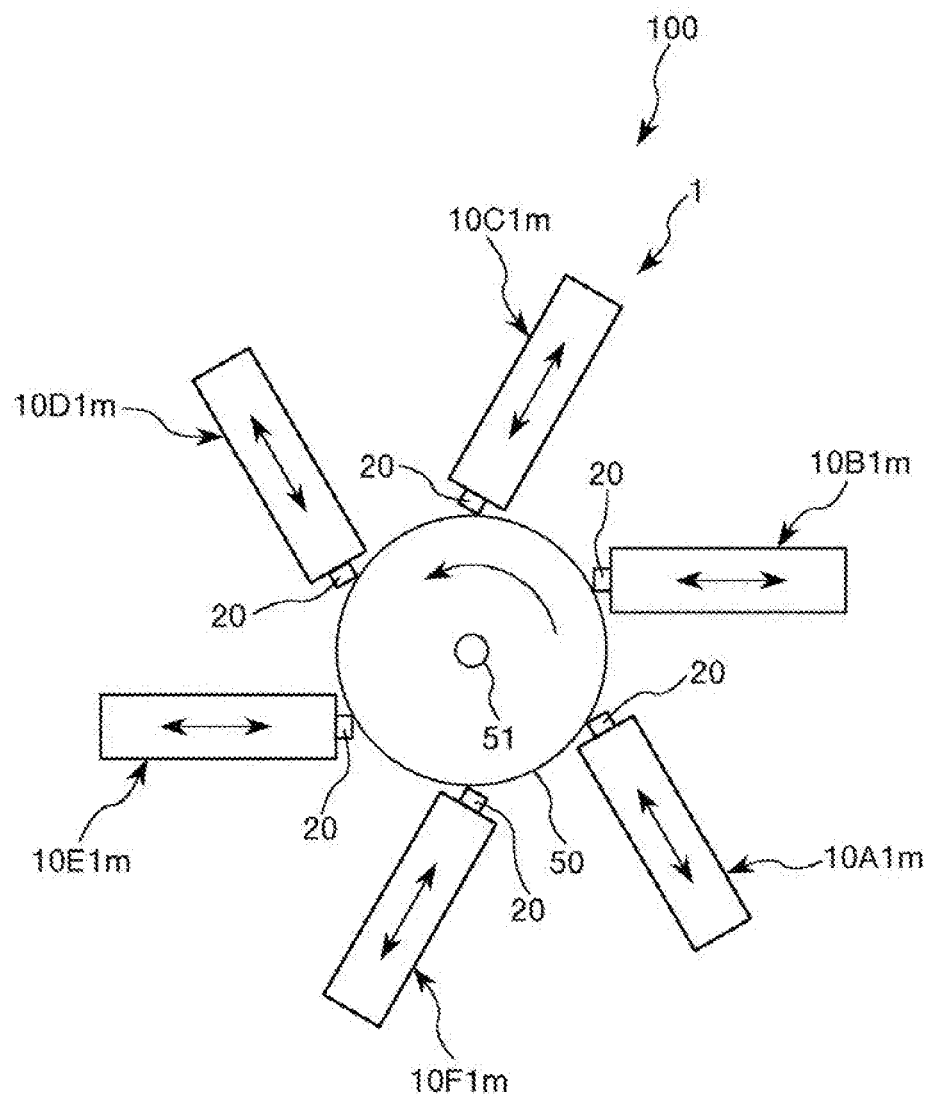
FIG. 5 is a plan view showing a driving device and a piezoelectric motor according to a third embodiment of the invention.
Figure 6:
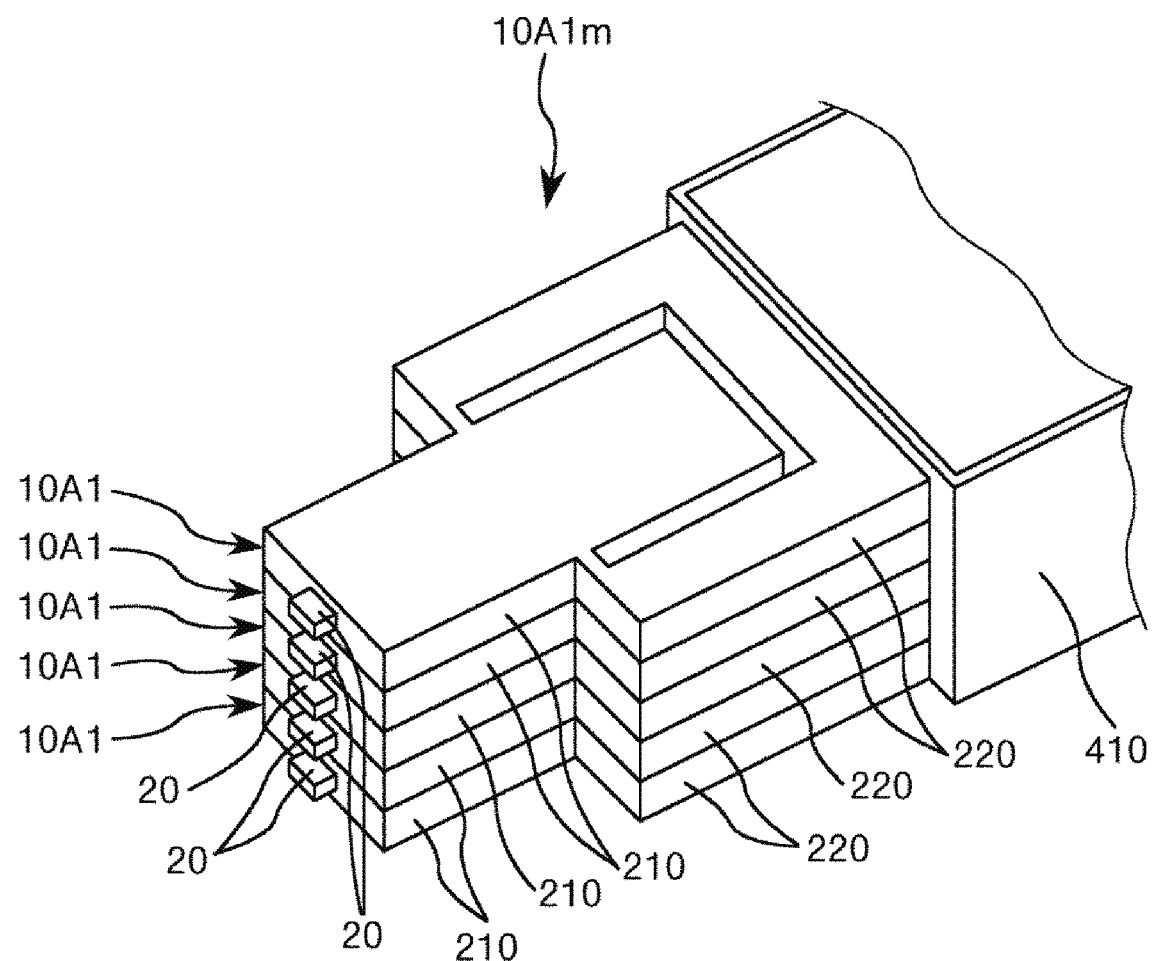
FIG. 6 is a perspective view showing a set of piezoelectric elements of the driving device shown in FIG. 5.

FIG. 5 is a plan view showing a driving device and a piezoelectric motor according to the third embodiment of the invention. FIG. 6 is a perspective view showing a set of piezoelectric elements of the driving device shown in FIG. 5.

As below, the third embodiment will be explained with a focus on the differences from the above described embodiments and the explanation of the same items will be omitted.

As shown in FIG. 5, a driving device 1 of the third embodiment includes six sets of vibrators 10A1*m*, 10B1*m*, 10C1*m*, 10D1*m*, 10E1*m*, and 10F1*m* and the above described drive circuit 300 (see FIGS. 3 and 4). As will be described later, each of the sets of vibrators 10A1*m*, 10B1*m*, 10C1*m*, 10D1*m*, 10E1*m*, and 10F1*m* includes a plurality of vibrators.

Next, the sets of vibrators 10A1*m*, 10B1*m*, 10C1*m*, 10D1*m*, 10E1*m*, and 10F1*m* will be explained, however, these configurations are the same and the set of vibrators 10A1*m* will be representatively explained.

As shown in FIG. 6, the set of vibrators 10A1*m* includes a plurality of, in the embodiment, five vibrators 10A1. Further, two or more vibrators 10A1 forming the set of vibrators 10A1*m*, in the embodiment, the five vibrators 10A1 are stacked one on top of the other. The five vibrators 10A1 are parallel-connected.

Thereby, compared to the case where the vibrators 10A1 are not stacked, the smaller size, lighter weight, and higher output may be realized.

The vibrator 10A1 includes a vibrating plate 210, a transmitting portion 20 provided in the end part of the vibrating plate 210 and transmitting drive power of the vibrators 10A1 to the driven member 50, and five piezoelectric elements 110*a*, 110*b*, 110*c*, 110*d*, and 110*e* (see FIG. 3) provided on the vibrating plate 210.

A wiring board 410 is connected to supporting parts 220 of the respective vibrators 10A1. The above described drive circuit 300 is connected to the end part of the wiring board 410.

In the driving device 1, the sets of vibrators 10A1*m*, 10B1*m*, 10C1*m*, 10D1*m*, 10E1*m*, and 10F1*m* are series-connected.

The arrangement of the sets of vibrators 10A1*m*, 10B1*m*, 10C1*m*, 10D1*m*, 10E1*m*, and 10F1*m* is not particularly limited, but, in the embodiment, the sets of vibrators 10A1*m*, 10B1*m*, 10C1*m*, 10D1*m*, 10E1*m*, and 10F1*m* are arranged at equal angular intervals in the order of the sets of vibrators 10A1*m*, 10B1*m*, 10C1*m*, 10D1*m*, 10E1*m*, and 10F1*m* counterclockwise in FIG. 5. That is, the set of vibrators 10A1*m* and the set of vibrators 10D1*m* are provided to face each other with the driven member 50 in between. Similarly, the set of vibrators 10B1*m* and the set of vibrators 10E1*m* are provided to face each other with the driven member 50 in between. Similarly, the set of vibrators 10C1*m* and the set of vibrators 10F1*m* are provided to face each other with the driven member 50 in between.

According to the above described third embodiment, the same advantages as those of the above described embodiments may be exerted.

Modified Example 1

In the third embodiment, the five vibrators are stacked, however, not limited to that. Two, three, four, six, or more vibrators may be stacked.

Fourth Embodiment

Figure 7:
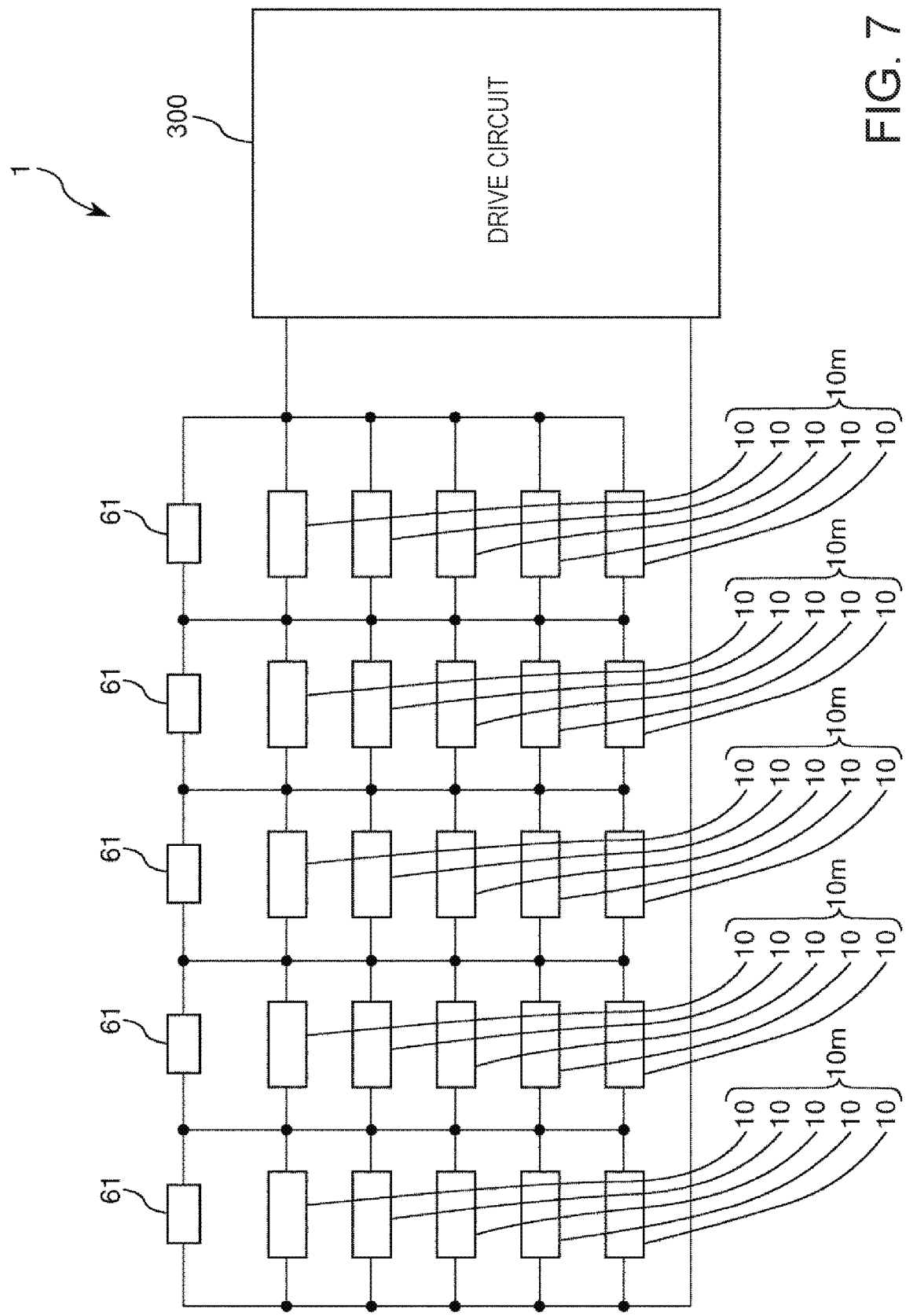
FIG. 7 is a block diagram showing a driving device according to a fourth embodiment of the invention.

FIG. 7 is a block diagram showing a driving device according to the fourth embodiment of the invention. Note that, in FIG. 7, wires in the respective vibrators are actually the same as the wires shown in FIG. 4, but simplified.

As below, the fourth embodiment will be explained with a focus on the differences from the above described embodiments and the explanation of the same items will be omitted.

As shown in FIG. 7, in a driving device 1 of the fourth embodiment, five vibrators 10 are parallel-connected and form a single set of vibrators 10*m*. Further, the five sets of vibrators 10*m* are series-connected. Note that the number of the parallel-connected vibrators 10 and the number of the series-connected sets of vibrators 10*m* are respectively not limited to five, may be two or more.

In each of the sets of vibrators 10*m* (vibrators 10), a voltage display part 61 as an example of a detection part (sensing part) that detects a physical quantity and an example of an informing part (display part) that informs is provided. Each voltage display part 61 is parallel-connected to the corresponding set of vibrators 10*m* (vibrators 10), and includes a detection part (not shown) that detects a voltage and a display part (not shown) that displays the voltage detected by the detection part.

In the driving device 1, when a short circuit abnormality is caused in one vibrator, the voltage detected by the voltage display part 61 connected to the set of vibrators 10*m* to which the vibrator 10 with the short circuit abnormality belongs is 0 V. Thereby, the set of vibrators 10*m* to which the vibrator 10 with the short circuit abnormality belongs may be known.

Or, when an open abnormality is caused in one vibrator, the voltage detected by the voltage display part 61 connected to the set of vibrators 10*m* to which the vibrator 10 with the open abnormality belongs increases. Thereby, the set of vibrators 10*m* to which the vibrator 10 with the open abnormality belongs may be known.

Note that the informing part is not limited to a device that displays the voltage, but may be e.g. a device that converts the voltage into other information and informs. Specific examples include e.g. a light emitting part of a neon tube with brightness changing according to the magnitude of the voltage, LED, organic EL, or the like and a liquid crystal element having a color changing according to the magnitude of the voltage or the like in place of the voltage display part 61.

The physical quantity detected by the detection part is not limited to the voltage, but may be e.g. a current, temperature, or the like.

According to the above described fourth embodiment, the same advantages as those of the above described embodiments may be exerted.

Further, in the fourth embodiment, when an abnormality such as a short circuit abnormality or open abnormality is caused in the vibrator 10, the set of vibrators 10*m* to which the vibrator 10 with the abnormality belongs may be specified, and thereby, the abnormality may be promptly and properly addressed.

Fifth Embodiment

Next, a robot according to the fifth embodiment of the invention will be explained.

Figure 8:
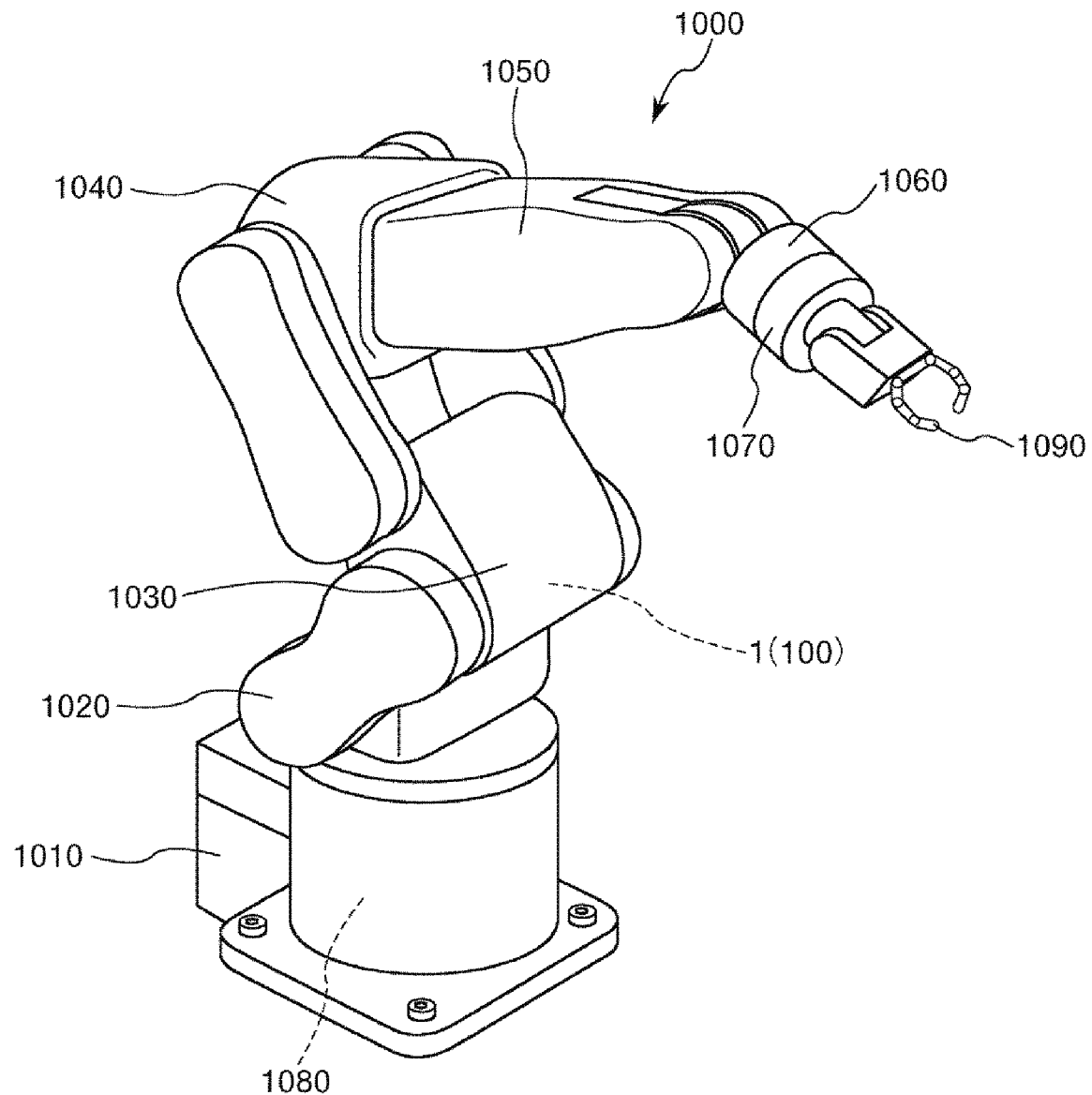
FIG. 8 is a perspective view of a robot according to a fifth embodiment of the invention.

FIG. 8 is a perspective view of the robot according to the fifth embodiment of the invention.

A robot 1000 shown in FIG. 8 may perform work of feeding, removing, carrying, assembly, etc. of precision apparatuses and components forming the apparatuses (objects). The robot 1000 is a six-axis robot, and has a base 1010 fixed to a floor or ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a control unit 1080 that controls driving of these arms 1020, 1030, 1040, 1050, 1060, 1070. Further, a hand connecting part is provided in the arm 1070, and an end effector 1090 according to work to be executed by the robot 1000 is attached to the hand connecting part. Driving devices 1 (piezoelectric motors 100) are mounted on the respective joint parts, and the respective arms 1020, 1030, 1040, 1050, 1060, 1070 rotate by driving of the driving devices 1. Note that the driving of the respective driving devices 1 is controlled by the control unit 1080.

The robot 1000 includes the driving devices 1 (piezoelectric motors 100), and thereby, may enjoy the above described advantages of the driving devices 1 and may exert good reliability.

Sixth Embodiment

Next, an electronic component conveyance apparatus according to the sixth embodiment of the invention will be explained.

Figure 9:
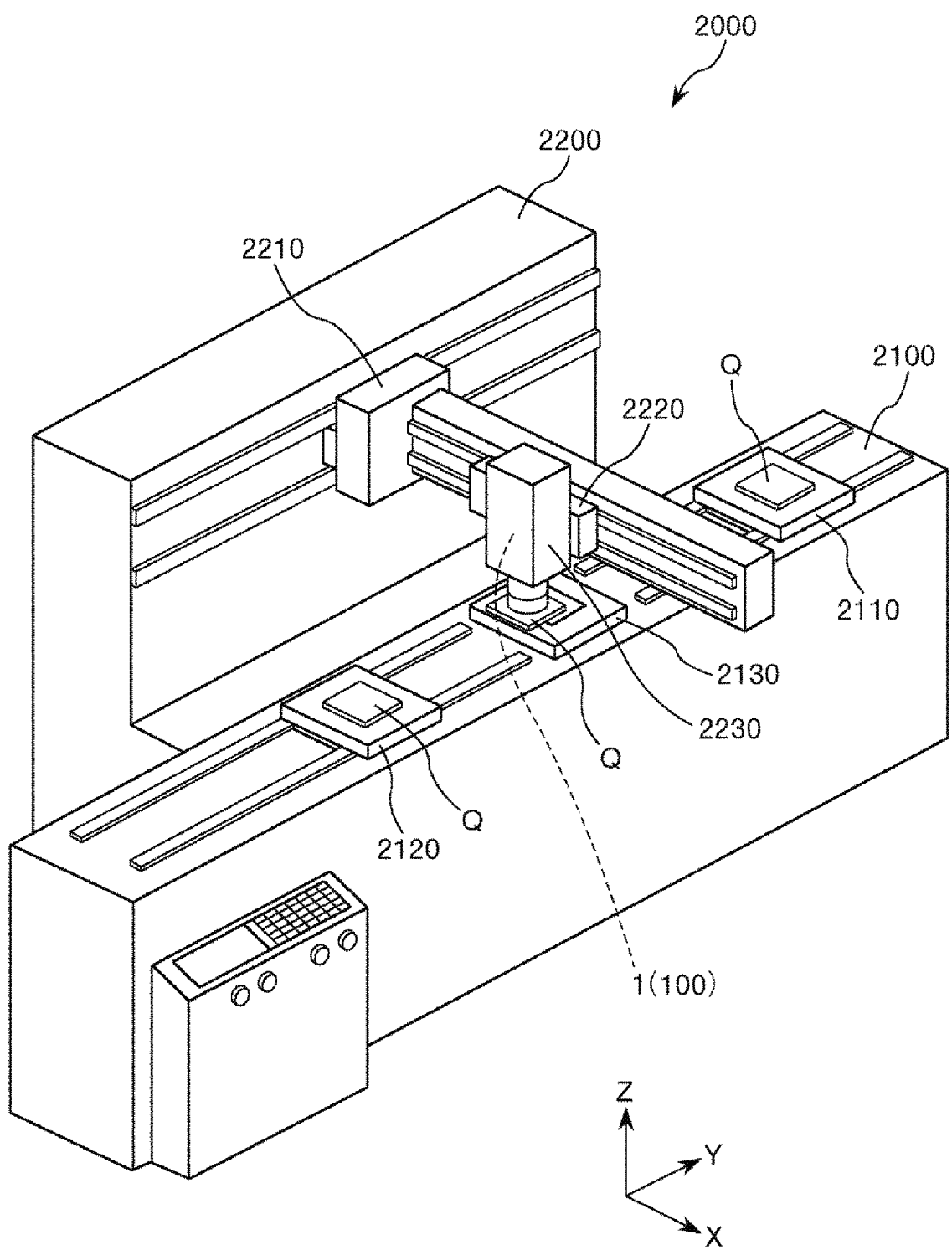
FIG. 9 is a perspective view of an electronic component conveyance apparatus according to a sixth embodiment of the invention.
Figure 10:
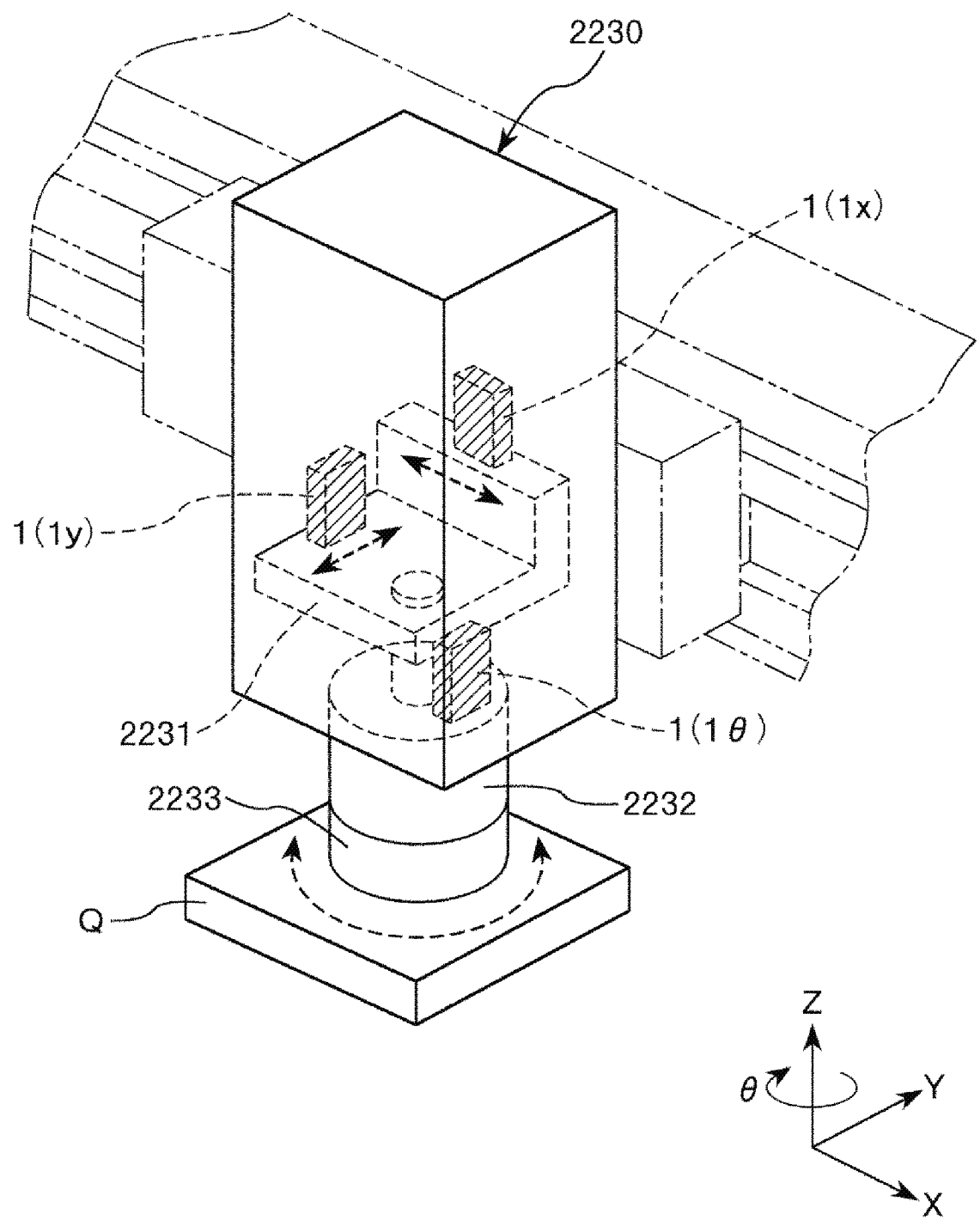
FIG. 10 is a perspective view of an electronic component holding part of the electronic component conveyance apparatus shown in FIG. 9.

FIG. 9 is a perspective view of the electronic component conveyance apparatus according to the sixth embodiment of the invention. FIG. 10 is a perspective view of an electronic component holding part of the electronic component conveyance apparatus shown in FIG. 9. Note that, hereinafter, for convenience of explanation, three axes orthogonal to one another are an X-axis, a Y-axis, and a Z-axis.

An electronic component conveyance apparatus 2000 shown in FIG. 9 is applied to an electronic component inspection apparatus, and has a base 2100 and a support 2200 provided on the side of the base 2100. Further, on the base 2100, an upstream stage 2110 on which an electronic component Q to be inspected is mounted and conveyed in the Y-axis direction, a downstream stage 2120 on which an electronic component Q that has been inspected is mounted and conveyed in the Y-axis direction, and an inspection table 2130 located between the upstream stage 2110 and the downstream stage 2120, on which electrical characteristics of an electronic component Q are inspected are provided. Note that examples of the electronic component Q include e.g. a semiconductor, semiconductor wafer, display device such as CLD and OLED, quartz device, various sensors, inkjet head, various MEMS devices, etc.

Further, a Y-stage 2210 movable in the Y-axis directions with respect to the support 2200 is provided on the support 2200, an X-stage 2220 movable in the X-axis directions with respect to the Y-stage 2210 is provided on the Y-stage 2210, and an electronic component holding part 2230 movable in the Z-axis directions with respect to the X-stage 2220 is provided on the X-stage 2220. As shown in FIG. 10, the electronic component holding part 2230 has a fine adjustment plate 2231 movable in the X-axis directions and the Y-axis directions, a rotation part 2232 rotatable about the Z-axis with respect to the fine adjustment plate 2231, and a holding part 2233 provided in the rotation part 2232 and holding the electronic component Q. Further, in the electronic component holding part 2230, a driving device 1 (1x) (piezoelectric motor 100) for moving the fine adjustment plate 2231 in the X-axis directions, a driving device 1 (1y) (piezoelectric motor 100) for moving the fine adjustment plate 2231 in the Y-axis directions, and a driving device 1 (1θ) (piezoelectric motor 100) for rotating the rotation part 2232 about the Z-axis are provided.

The electronic component conveyance apparatus 2000 includes the driving devices 1 (piezoelectric motors 100), and thereby, may enjoy the above described advantages of the driving devices 1 and may exert good reliability.

As above, the driving device, piezoelectric motor, electronic component conveyance apparatus, and robot according to the invention are explained based on the illustrated embodiments, however, the invention is not limited to those. The configurations of the respective parts may be replaced by arbitrary configurations having the same functions. Further, other arbitrary configurations may be added thereto.

The invention may include a combination of arbitrary two or more configurations (features) of the above described respective embodiments.

The entire disclosure of Japanese Patent Application No. 2016-186598, filed Sep. 26, 2016 is expressly incorporated by reference herein.

What is claimed is:

1. A driving device comprising a plurality of motive power generators that receive electric power supply and generate motive power,
   the plurality of motive power generators forming a plurality of sets of motive power generators in which two or more of the motive power generators are electrically parallel-connected, and
   the plurality of sets of motive power generators electrically series-connected.

2. A driving device comprising a plurality of vibrators that receive electric power supply and vibrate and provide drive power for driving a driven member to the driven member,
   the plurality of vibrators forming a plurality of sets of vibrators in which two or more of the vibrators are electrically parallel-connected, and
   the plurality of sets of vibrators electrically series-connected.

3. The driving device according to claim 2, further comprising a drive circuit that drives the plurality of vibrators.

4. The driving device according to claim 2, further comprising a transmitting portion that transmits the drive power of the vibrators to the driven member.

5. The driving device according to claim 2, wherein the two or more vibrators forming the set of vibrators are stacked one on top of the other.

6. The driving device according to claim 2, wherein the vibrator includes a piezoelectric element.

7. A piezoelectric motor comprising:
   a driven member; and
   the driving device according to claim 2 that drives the driven member.

8. A piezoelectric motor comprising:
   a driven member; and
   the driving device according to claim 3 that drives the driven member.

9. A piezoelectric motor comprising:
   a driven member; and
   the driving device according to claim 4 that drives the driven member.

10. A piezoelectric motor comprising:
    a driven member; and
    the driving device according to claim 5 that drives the driven member.

11. A piezoelectric motor comprising:
    a driven member; and
    the driving device according to claim 6 that drives the driven member.

12. An electronic component conveyance apparatus comprising the driving device according to claim 1.

13. An electronic component conveyance apparatus comprising the driving device according to claim 2.

14. An electronic component conveyance apparatus comprising the driving device according to claim 3.

15. An electronic component conveyance apparatus comprising the driving device according to claim 4.

16. An electronic component conveyance apparatus comprising the driving device according to claim 5.

17. A robot comprising the driving device according to claim 1.

18. A robot comprising the driving device according to claim 2.

19. A robot comprising the driving device according to claim 3.

20. A robot comprising the driving device according to claim 4.

* * * * *